(12) United States Patent
Shimizu et al.

(10) Patent No.: US 8,439,521 B2
(45) Date of Patent: May 14, 2013

(54) LIGHT-EMITTING MODULE AND LUMINAIRE

(75) Inventors: Keiichi Shimizu, Yokosuka (JP); Hiroaki Watanabe, Yokosuka (JP); Naoki Sugishita, Yokosuka (JP); Homare Takai, Yokosuka (JP)

(73) Assignees: Toshiba Lighting & Technology Corporation, Kanagawa (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/233,049

(22) Filed: Sep. 15, 2011

(65) Prior Publication Data

US 2012/0002425 A1 Jan. 5, 2012

Related U.S. Application Data

(63) Continuation of application No. PCT/JP2010/056336, filed on Apr. 7, 2010.

(30) Foreign Application Priority Data

Apr. 10, 2009 (JP) ................................ 2009-096117

(51) Int. Cl.
F21V 7/09 (2006.01)

(52) U.S. Cl.
USPC ...... 362/247; 362/241; 362/249.02; 362/294; 362/240

(58) Field of Classification Search .................. 362/227, 362/241, 243, 245, 247, 249.02, 294, 362, 362/367, 545, 240, 290, 291, 342
See application file for complete search history.

(56) References Cited

U.S. PATENT DOCUMENTS

| | | | | | |
|---|---|---|---|---|---|
| 4,254,453 | A | * | 3/1981 | Mouyard et al. | 362/240 |
| 4,914,731 | A | * | 4/1990 | Chen | 340/815.45 |
| 5,043,716 | A | * | 8/1991 | Latz et al. | 345/82 |
| 7,275,841 | B2 | * | 10/2007 | Kelly | 362/345 |

(Continued)

FOREIGN PATENT DOCUMENTS

| | | |
|---|---|---|
| JP | 2003-115615 | 4/2003 |
| JP | 2004-253478 | 9/2004 |

(Continued)

OTHER PUBLICATIONS

International Search Report issued in PCT/JP2010/056336 on May 18, 2010.

(Continued)

*Primary Examiner* — Ismael Negron
(74) *Attorney, Agent, or Firm* — DLA Piper LLP (US)

(57) ABSTRACT

According to one embodiment, a light-emitting module includes a substrate, a light-emitting element, a light distribution control member, and a cover. The substrate includes a surface on which a thermally conductive portion and a interconnect pattern are formed. The light-emitting element is thermally connected to the thermally conductive portion, is electrically connected to the interconnect pattern, and generates heat while emitting light. The light distribution control member is thermally connected to the thermally conductive portion at a periphery of the light-emitting element, includes a ridge portion formed on an exit side where light emitted from the light-emitting element is projected, and is configured to control distribution of the light emitted from the light-emitting element. The cover is thermally connected to the ridge portion and configured to pass therethrough the light emitted from the light-emitting element.

16 Claims, 4 Drawing Sheets

U.S. PATENT DOCUMENTS

| | | | |
|---|---|---|---|
| 7,312,927 B2 * | 12/2007 | Bogner et al. ............... 359/630 |
| 7,521,872 B2 * | 4/2009 | Bruning ....................... 315/158 |
| 7,717,590 B1 * | 5/2010 | Li ................................ 362/294 |
| 8,029,170 B2 * | 10/2011 | Lee .............................. 362/373 |
| 8,061,876 B2 * | 11/2011 | Oide et al. ................... 362/297 |
| 8,157,414 B2 * | 4/2012 | Schaefer et al. ............. 362/245 |
| 2003/0156416 A1 * | 8/2003 | Stopa et al. .................. 362/294 |
| 2005/0133852 A1 | 6/2005 | Shau |
| 2007/0139935 A1 * | 6/2007 | Kim et al. .................... 362/362 |
| 2008/0007953 A1 * | 1/2008 | Keller et al. ................. 362/294 |
| 2008/0062686 A1 * | 3/2008 | Hoelen et al. ................ 362/240 |
| 2009/0135581 A1 * | 5/2009 | Yano et al. ..................... 362/84 |
| 2009/0257224 A1 * | 10/2009 | Huang et al. ................ 362/235 |
| 2009/0273924 A1 * | 11/2009 | Chiang ........................ 362/241 |
| 2009/0290354 A1 * | 11/2009 | Moriyama et al. ....... 362/296.01 |
| 2010/0259935 A1 * | 10/2010 | Scordino et al. ............. 362/294 |
| 2011/0058376 A1 * | 3/2011 | Lin et al. ..................... 362/294 |

FOREIGN PATENT DOCUMENTS

| | | |
|---|---|---|
| JP | 2005-158368 | 6/2005 |
| JP | 2006-004632 | 1/2006 |
| JP | 2008-117558 | 5/2008 |
| JP | 3141579 | 5/2008 |
| TW | M298079 | 9/2006 |

OTHER PUBLICATIONS

English Language Abstract of JP 2005-158368 published on Jun. 16, 2005.

English Language Translation of JP 2005-158368 published on Jun. 16, 2005.

English Lanugage Abstract of JP 2003-115615 published Apr. 18, 2003.

English Lanuage Abstract Translation of JP 2003-115615 published Apr. 18, 2003.

English Language Abstract of JP 2008-117558 published May 22, 2008.

English Language Translation of JP 2008-117558 published May 22, 2008.

English Language Abstract of JP 2006-004632 published Jan. 5, 2006.

English Language Tranlsation of JP 2006-004632 published Jan. 5. 2006.

English Language Translation of JP 3141579 published on May 8, 2008.

English Language Abstract of JP 2004-253478 published Sep. 9, 2004.

English Language Translation of JP 2004-253478 published Sep. 9, 2004.

Taiwanese Office Action and Search Report issued in TW 10121000280 on Sep. 21, 2012.

English Language Translation of Taiwanese Office Action and Search Report issued in TW 10121000280 on Sep. 21, 2012.

English Language Abstract of TW M298079 published Sep. 21, 2006.

* cited by examiner

LIGHT-EMITTING MODULE AND LUMINAIRE

CROSS-REFERENCE TO RELATED APPLICATIONS

This application is a Continuation Application of PCT Application No. PCT/JP2010/056336, filed Apr. 7, 2010 and based upon and claiming the benefit of priority from prior Japanese Patent Application No. 2009-096117, filed Apr. 10, 2009, the entire contents of all of which are incorporated herein by reference.

FIELD

Embodiments described herein relate generally to a light-emitting module and a luminaire that transfers heat generated in a light-emitting element to a light emitting side and radiates the heat from a side of a translucent cover.

BACKGROUND

Along with an increase in output power and efficiency of a light-emitting diode (LED), the LED is capable of outputting luminous flux similar to that of a fluorescent lamp. With a wide spread use of such an LED, a luminaire such as an LED base light and an LED down light having an LED as a light source is developed.

An LED as a light source has a feature of a long life as compared with other light sources based on the technologies to date. This is advantageous in the maintenance, because the frequency of replacing the light sources or the luminaires are reduced. Further, a single piece of LED is compact and therefore has a high degree of freedom in optical design. With a development of a further efficient LED, a luminaire of a type different from the conventional one will be developed.

In the meantime, the LED is affected by heat generated while being lit, which causes a decrease in luminous flux, light-emitting efficiency, or a life of the LED. For this reason, it is necessary to design the light-emitting module or the luminaire having the LED as a light source by considering how to dissipate the heat generated by the LED. Therefore, the luminaire that utilizes the LED as a light source is subject to a structural restriction or the like, despite the fact that a single LED itself is compact and light.

A luminaire using an LED as a light source is described in Jpn. Pat. Appln. KOKAI Publication No. 2004-253478. This luminaire includes a substrate on which a plurality of LEDs are arranged and a reflecting plate provided with reflection surfaces that individually surround the LEDs. Such a luminaire, in general, should have a structure in which heat is radiated from a rear side opposite to an illumination side. For example, a luminaire of a ceiling-embedded type has a structure in which heat is radiated from a rear side thereof toward the ceiling cavity. A luminaire of a ceiling-mounted type is provided with a gap through which air flows between a ceiling surface and a rear surface of the luminaire.

BRIEF DESCRIPTION OF THE DRAWINGS

FIG. 3 is a partially enlarged cross sectional view of a connecting portion between a thermally conductive portion and a light distribution control member, and a connecting portion between the light distribution controlling member and a cover which are illustrated in. FIG. 2;

DETAILED DESCRIPTION

A luminaire of a type that radiates heat from a rear side thereof becomes bulky by a volume of mechanism for radiating heat which is provided on the rear side thereof. Further, when this type of luminaire is attached to a ceiling made of a material having a heat insulating function, the structure of the luminaire becomes further bulky because the radiation function should be improved. In view of this, according to the present invention, a light-emitting module and a luminaire that can maintain the radiation performance even if they are attached directly to a ceiling having a heat insulating performance are provided.

In general, according to one embodiment, a light-emitting module includes a substrate, a light-emitting element, a light distribution control member, and a cover. The substrate includes a surface on which a thermally conductive portion and a interconnect pattern are formed. The light-emitting element is thermally connected to the thermally conductive portion, is electrically connected to the interconnect pattern, and generates heat while emitting light. The light distribution control member is thermally connected to the thermally conductive portion at a periphery of the light-emitting element, includes a ridge portion formed on an exit side where light emitted from the light-emitting element is projected, and is configured to control distribution of the light emitted from the light-emitting element. The cover is thermally connected to the ridge portion and configured to transparently or translucently pass therethrough the light emitted from the light-emitting element.

In this case, it is possible to apply a ceramic material or a synthetic resin material that are relatively excellent in a heat radiation property and durability, when an insulating material is used as a substrate. One example of the synthetic resin material used as the substrate is a glass epoxy resin. Further, it is preferable to use a material that is excellent in heat conductivity and heat radiation performance such as aluminum or copper, when a metallic material is used as the substrate.

In this specification, a "thermally conductive portion" refers to a portion having a coefficient of thermal conductivity that is at least equal to or larger than that of the substrate, and is preferably formed of a member having a coefficient of thermal conductivity larger than that of the substrate. The "thermally conductive portion" is preferably formed of a metal such as copper or aluminum. For example, in the case where the substrate is a metallic substrate, it is possible to arrange the substrate as the thermally conductive portion. As a member having an excellent coefficient of thermal conductivity, a copper, aluminum, or silicon substrate can be used.

It is preferable to use a light-emitting element formed of an light-emitting diode, an organic EL, a semiconductor laser, or the like as a light-emitting source. However, the light-emitting source is not particularly restricted, and the light source that is compact and suitable for mounting on the substrate can be used in addition to these examples. Further, the light-emitting element may be formed of an element that emits white light, or red, blue, green, or a combination of these colors can be used according to an application thereof.

A term "thermally connecting" means that members are configured to transmit heat directly at a connecting portion between members. This means that the members may be merely made contact with each other, or connected to each other via an adhesive or the like to widen a contact area. When the members are thermally connected, it is preferable that the members be strongly pressed against each other, or filled in an air layer between contacting faces of the members with a silicone resin, an adhesive, or the like.

A interconnect pattern is a conductive member such as printed wiring formed on the substrate for supplying power to the light-emitting element mounted on the substrate. A mounting portion of the light-emitting element which is electrically connected to the interconnect pattern is a portion that makes the light-emitting element conductive to the interconnect pattern. For example, a soldered portion is the mounting portion, when the light-emitting element is attached to the interconnect pattern by a soft brazing material such as Sn—Ag—Cu solder.

A ridge portion is an end portion of a light distribution control member on an exit side where light emitted from the light-emitting element is projected. In the case where a plurality of light-emitting elements are laid on a surface of the substrate, the ridge portion is provided between the light-emitting elements so as to cover an outer periphery of each of the light-emitting elements. In this case, the ridge portion is thermally connected to the cover along an entire circumference of an outer periphery of the light-emitting element.

The interconnect pattern may also serve as the thermally conductive portion. In this case, the light-emitting element is electrically and thermally connected to the interconnect pattern. In the case where the thermally conductive portion serves as the interconnect pattern, the thermally conductive portion is continuously formed with the interconnect pattern. Further, the thermally conductive portion is formed on 70% or more of an area of the surface of the substrate.

Individual thermal conduction properties of a first connecting portion between the light-emitting element and the thermally conductive portion, the thermally conductive portion, a second connecting portion between the thermally conductive portion and the light distribution control member, the light distribution control member, a third connecting portion between the ridge portion and the cover, and the cover are set such that a temperature difference between the first connecting portion serving as a heat entry portion and a light exit surface of the cover serving as a thermally radiative portion becomes no greater than 15 [K] (Kelvin).

A luminaire according to the present invention is provided with a substrate, a light-emitting element, a light distribution control member, a cover, a main body, and a lighting circuit. The substrate, the light-emitting element, the light distribution control member, and the cover are arranged similarly as in the case of the foregoing light-emitting module. The main body holds at least the substrate. The lighting circuit is connected to the interconnect pattern formed on the surface of the substrate and controls lighting of the light-emitting element.

In the case of this luminaire, input power, for the light-emitting element, per unit area of a light exit surface of the cover serving as a thermally radiative portion is no greater than 400 [W/m$^2$] (watt per square meter). The light exit surface of the cover is a surface on a side from which light emitted from the light-emitting element is exited.

According to the light-emitting module of the present invention, the light-emitting element and the thermally conductive portion, the thermally conductive portion and the light distribution control member, and the light distribution control member and the cover are thermally connected to each other individually. Therefore, heat generated by the light-emitting element can be radiated from the light emit surface of the cover that serves as the thermally radiative portion. In addition, according the light-emitting module that is bonded to the cover at the ridge portion along an entire circumference of the outer periphery of the light-emitting element, it is possible to uniformly conduct heat radiated from one light-emitting element to the cover. According to the light-emitting module whose thermally conductive portion also serves as a interconnect pattern, heat generated by the light-emitting element can be easily collected by the thermally conductive portion, which improves the heat radiation efficiency. According to the light-emitting module whose thermally conductive portion is formed on 70% or more of an area of the surface of the substrate, it is possible to make the temperature of the substrate uniform all over. Accordingly, the heat is securely conducted from the light-emitting element to a side of the cover. According to the light-emitting module of which the first connecting portion, the thermally conductive portion, the second connecting portion, the light distribution control member, the third connecting portion, and the cover are arranged so that a temperature difference between the heat entry portion and the thermally radiative portion along the thermally conductive path becomes no greater than 15 [K], it is possible to suppress an excessive increase in temperature of the first connecting portion.

According to the luminaire of the present invention, it is possible to provide a luminaire having the effects of the foregoing light-emitting module. Since heat generated by the light-emitting element is radiated in a direction identical with a direction in which light emitted from the light-emitting element is radiated, there is no concern over the heat being accumulated in the rear side. Accordingly, in the case where the luminaire is embedded into a wall such as a ceiling or attached onto a wall, no consideration on exhausting heat on the rear side of the main body is required. This means that the thickness of the luminaire can be made smaller in a light emitting direction.

Further, according to the luminaire in which input power, for the light-emitting element, per unit area of the light exit surface of the cover serving as the thermally radiative portion is no greater than 400 [W/m$^2$], in the case where an ambient temperature is set at 25[° C.] (degree Celsius), and a coefficient of heat transfer of the cover on the light exit side is 10 [W/m$^2$K] (watt per square meter Kelvin), the temperature of the first connecting portion is suppressed so that it does not increase by 55 [K] or larger relative to the ambient temperature. The luminaire can assure sufficient reliability for a long time use. Further, since the input power to the light-emitting element is restricted, a light amount exiting from a unit area of the cover becomes a given value or smaller. Since the brightness on the light exit surface is regulated, this luminaire can provide a comfortable luminous environment.

Figure 1:
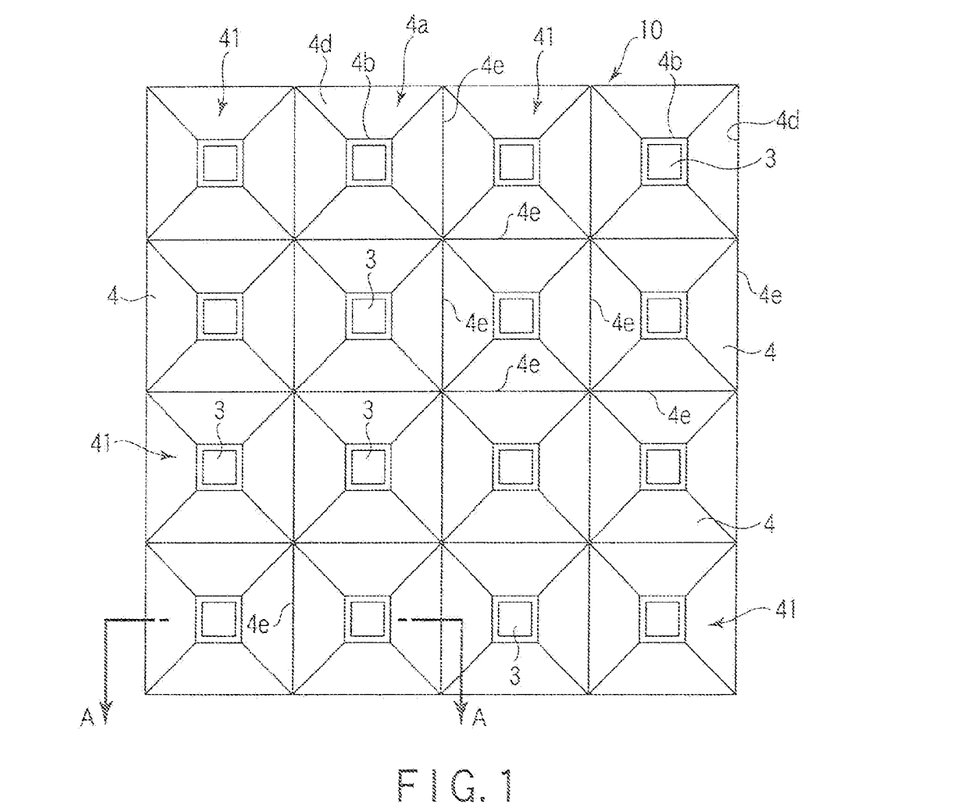
FIG. 1 is a plan view viewed from a light exit side of a light-emitting module according to the present invention.
Figure 2:
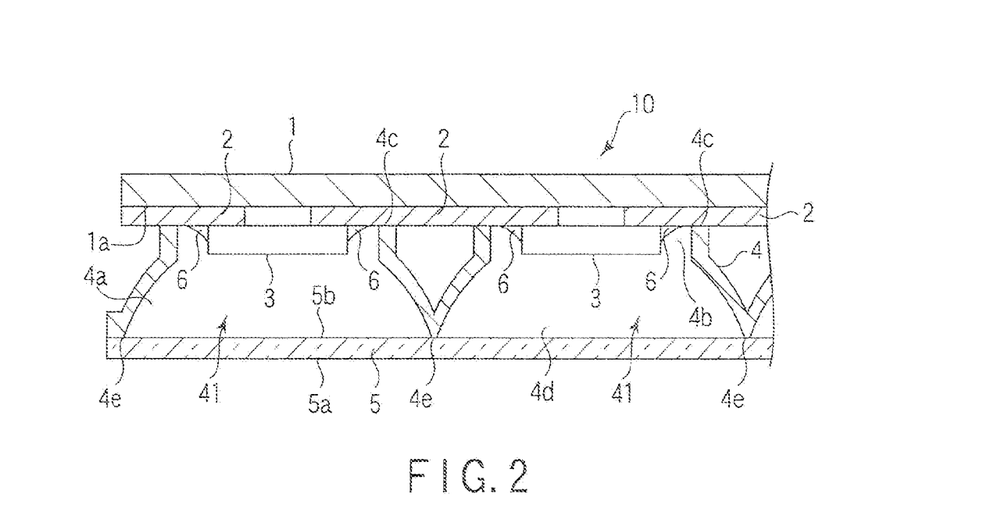
FIG. 2 is a partially enlarged cross sectional view of the light-emitting module taken along a line A-A in FIG. 1.

A light-emitting module 10 according to an embodiment of the present invention will be described with reference to FIGS. 1, 2, 3, and 4. The light-emitting module 10 is formed in a quadrangular shape in plan view as shown in FIG. 1. The light-emitting module 10 is provided with a substrate 1, a light-emitting diode (LED) 3 serving as a light-emitting element, a reflecting plate 4 serving as a light distribution control member, and a cover 5 as shown in FIG. 2.

The substrate 1 has copper foils 2, each of which is serving as a thermally conductive member and a interconnect pattern, on a surface 1a. The substrate 1 is made of a glass epoxy resin.

Figure 4:
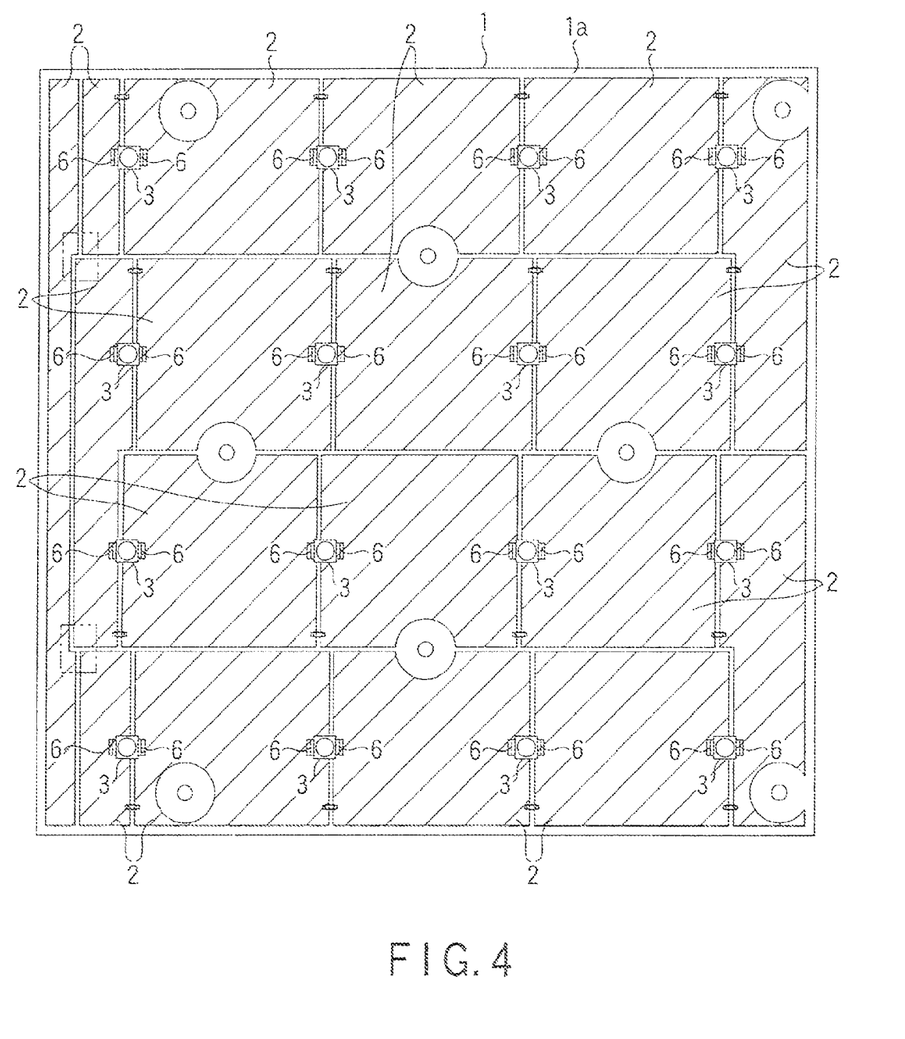
FIG. 4 is a plan view illustrating a layout of a interconnect pattern and the thermally conductive portion provided on a substrate illustrated in FIG. 2.

The copper foil 2 is arranged so that the thermally conductive portions thereof and the interconnect pattern thereof correspond to the arrangement of the LEDs 3 as illustrated in FIG. 4. The copper foil 2 is formed in an area indicated by hatching in FIG. 4. The copper foil 2 on the substrate 1 may have a portion which is electrically insulated from the interconnect pattern. The copper foil 2 is formed to take about 70% or more of an area of the surface 1a of the substrate 1 as a whole.

The LEDs 3 are disposed on the surface 1a of the substrate 1 in a square matrix as shown in FIGS. 1 and 4. In the case of the light-emitting module 10 according to this embodiment, a total of 16 pieces of the LEDs 3 are arranged in a square matrix with 4 rows and 4 columns. Each of the LEDs 3 is thermally and electrically bonded to the copper foil 2 by solder 6 and mounted on the substrate 1 as shown in FIGS. 2 and 4. A portion where the solder 6 is formed is a mounting portion and serves as a first connecting portion between the light-emitting element and the thermally conductive portion.

The reflecting plate 4 is made of a synthetic resin having heat resistance and electric insulation, and made of white polybutylene terephthalate (PBT) in this embodiment. The reflecting plate 4 is provided to control distribution of light emitted from each LED. Each cup 41 of the reflecting plate 4 corresponding to each of the LEDs 3 is formed in an inverted pyramid shape viewed from a light exit side. In other words, the cup 41 forms a concave portion 4a which is rectangular and a so-called "mortar shape", as illustrated in FIG. 2. The LEDs 3, which are arranged as previously described, are positioned individually in the centers of openings 4b in the bottom portions.

Figure 3:
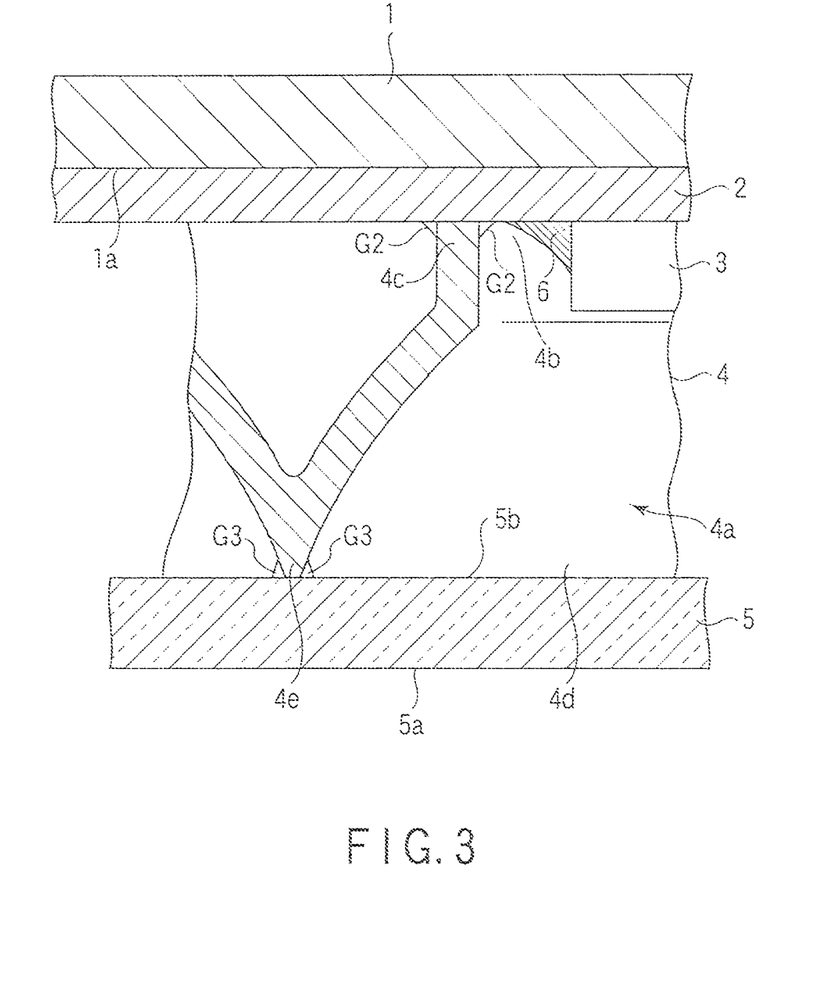

The reflecting plate 4 is provided in a manner to surround each of the LEDs 3 as shown in FIG. 2. A peripheral edge portion 4c, which is formed in an edge of the opening 4b of each of the cups 41 of the reflecting plates 4 located on an incident side of the light distribution control member, is thermally connected to the copper foil 2 by an adhesive G2 as shown in FIG. 3. The portion bonded by the adhesive G2 is a second connecting portion between the copper foil 2 serving as the thermally conductive portion and the light reflecting plate 4 serving as the light distribution control member.

In addition, the light reflecting plate 4 has rectangular-shaped opening portions 4d corresponding to each of the LEDs 3 for allowing to project light emitted from the LED 3 as shown in FIG. 2. These opening portions 4d are formed on a side opposite to the openings 4b in a thickness direction of the substrate 1. A ridge portion 4e having an even height is formed in each of the opening portion 4d between the adjacent opening portions 4d as shown in FIGS. 2 and 3.

The cover 5 is provided on a side of the surface 1a of the substrate 1 on which the reflecting plate 4 is disposed and on a light exit side of the reflecting plate 4. The cover has a transparence or a translucence which is enough to pass the light. The cover 5 allows the light emitted from the LED 3 to project from an outer surface 5a which serves as an exit surface. As illustrated in FIG. 3, an inner surface 5b of the cover 5 which faces the reflecting plate 4 is thermally connected to the ridge portion 4e of the reflecting plate 4 by an adhesive G3. The portion bonded by the adhesive G3 is a third connecting portion between the reflecting plate 4 serving as the light distribution control member and the cover 5.

Further, the ridge portion 4e of the reflecting plate 4 is bonded to the cover 5 along an entire circumference of an outer periphery of each of the LEDs 3. The adhesive G2 used for the second connecting portion and the third adhesive G3 used for the third connecting portion are, for example, a silicone resin.

The cover 5 is made of transparent acrylic in this embodiment. However, the cover 5 may have a white or opalescent color so long as light permeates therethrough, or may contain fine particles such as chaff or optical fibers which scatter light that is transmitting through the cover 5. A treatment for diffusing light may be applied to a surface of the cover 5.

As a result of the foregoing structure, thermally conductive paths are respectively formed in the light-emitting module 10 from each of the LEDs 3 which are light-emitting elements to the outer surface 5a of the cover 5. The thermally conductive path is formed of the solder 6 serving as the first connecting portion, the copper foil 2 serving as the thermally conductive portion and the interconnect pattern, the adhesive G2 serving as the second connecting portion, the reflecting plate 4 serving as the light distribution control member, the adhesive G3 serving as the third connecting portion, and the cover 5, and transfers the heat in this sequence from the LED 3 to the cover 5. A heat-transfer property for the thermally conductive path is set in that a temperature difference between the solder 6 serving as a heat entry portion and the outer surface 5a of the cover 5 serving as a heat radiating portion becomes no greater than 15 [K]. The heat-transfer property in this context is decided by variables related to conducting heat such as a heat transfer coefficient between individual members, a thermal conductivity within each member, a contacting area between individual members, and a physical length and cross section as the thermally conductive path.

Next, a description will be given of working of this embodiment.

When the LED 3 of the light-emitting module 10 is lit by being supplied power, light emitted from the LEDs 3 is controlled by the reflecting plate 4 in the distribution of light, passes through the cover 5, and exits from the outer surface 5a. The LED 3 generates heat when the electric energy is converted into a light. The heat generated at the LED 3 is transferred to the copper foil 2 through the solder 6 or from a portion that directly contacts with the LED 3. In this case, the copper foil 2 is formed on 70% or more of an area of the surface of the substrate 1. Further, the copper foil 2 has a high thermal conductivity. As a result, the substrate 1 tends to average an entire temperature distribution even immediately after the LED 3 is lit or extinguished.

The heat transmitted to the copper foil 2 is further transferred to the substrate 1 and the reflecting plate 4. In this case, the heat is mainly transferred through the adhesive G2 to the reflecting plate 4 which has low heat resistance as compared with that of the substrate 1. Since the heat is transferred to the cover 5 from the ridge portion 4e of the reflecting plate 4 through the adhesive G3, the heat is radiated from the outer surface 5a of the cover 5. Therefore, the cover 5 functions as a heat radiating portion in this light-emitting module 10.

The heat distribution in the light-emitting module 10 becomes stable when a certain time elapses after the LED 3 is lit. The inventors of the present invention conducted an experiment and found that, as a result the experiment, the thermally conductive path can be formed on the same side as light is emitted from the LED 3 by arranging a temperature difference between the solder 6 serving as the heat entry portion and the outer surface 5a of the cover 5 serving as the heat radiating portion at no greater than 15 [K] (Kelvin). For example, if the copper foil 2 and the reflecting plate 4, and the reflecting plate 4 and the cover 5 are not thermally connected, the temperature difference between the solder 6 and the cover 5 becomes about 30 [K]. In this case, the heat can be more easily transferred from the copper foil 2 to the substrate 1 than from the copper foil 2 to the reflecting plate 4. Accordingly, the heat is mainly radiated from the rear side of the substrate 1.

Therefore, the thermally conductive path is configured to be formed in that the temperature difference between the solder 6 and the outer surface 5a of the cover 5 becomes no greater than 15 [K], in this embodiment. Alternatively, the thermally conductive path may be configured to be formed in that the heat generated by the LED 3 is more easily transmitted to the obverse side on which the light from the LED 3 is emitted than the heat that is conducted to the rear side of the substrate 1. Accordingly, setting of the temperature difference is not restricted to no greater than 15 [K]. However, even in the case where the thermally conductive path is formed so that the heat is easily conducted to the side where the light is allowed to exit, if the temperature difference becomes larger, a heat load is applied to the solder 6 or the adhesive G2 serving as the second connecting portion. Therefore, the temperature difference between the solder 6 and the cover 5 is set within a range by which the soundness of the solder 6 and the adhesive G2 is maintained.

The above embodiment describes the case in which the copper foil 2 is formed on the substrate 1 made of a glass epoxy resin. However a similar effect can also be obtained by employing a metallic substrate as the substrate 1 instead of the glass epoxy resin and forming the substrate 1 itself as the thermally conductive portion. The material to be used as the metallic substrate includes not only copper and aluminum but also a silicon substrate. When the metallic substrate using such material is employed, the substrate 1 functions as the thermally conductive portion. In this case, since the copper foil 2 may simply serve at least as the wiring pattern, the copper foil 2 may be formed at minimum for supplying power to each of the LEDs 3.

Further, even if the substrate 1 is made of a glass epoxy resin as adopted in the embodiment described above, the copper foil 2 may be arranged by being divided into the thermally conductive portion and the wiring pattern. In this case, both the thermally conductive portion and the wiring pattern may be formed of copper foil or materials different from each other according the application purposes. When the interconnect pattern are separately formed into the thermally conductive portion and the wiring pattern, they may be arranged on an identical plane or may be overlapped each other with an insulating layer interposed therebetween.

Figure 5:
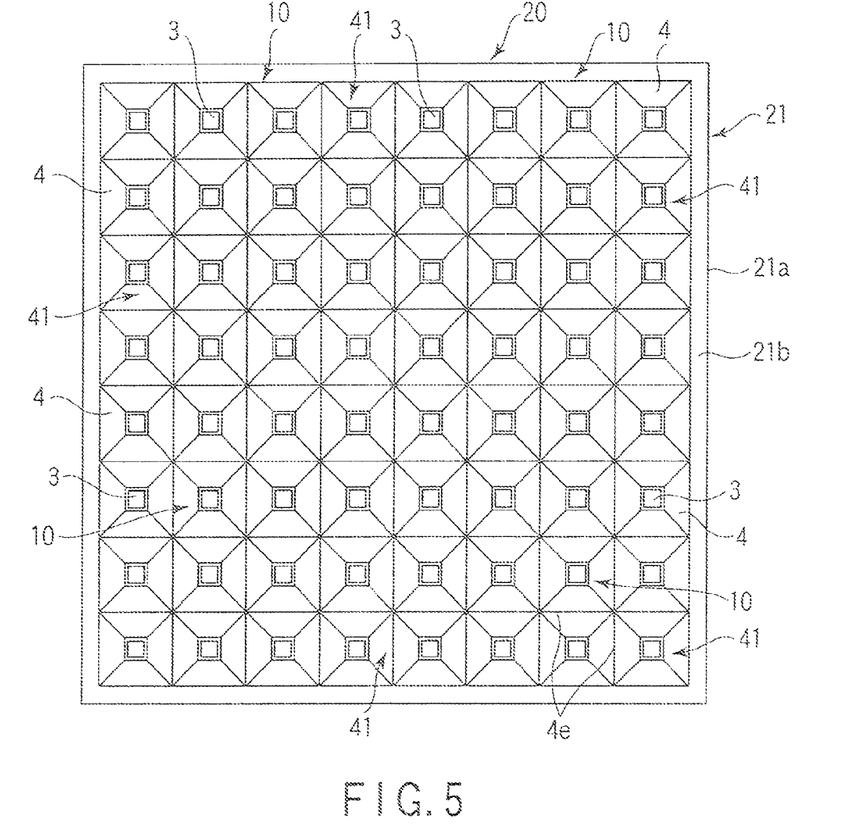
FIG. 5 is a front view of a luminaire according to the present invention provided with the light-emitting module illustrated in FIG. 1.
Figure 6:
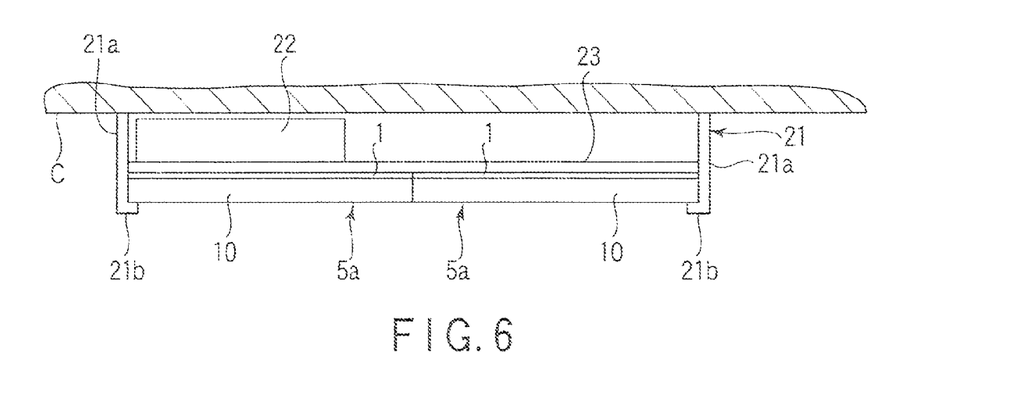
FIG. 6 is a cross sectional view illustrating a state where the luminaire illustrated in FIG. 5 is attached to a ceiling.

Next, a luminaire 20 using the above-mentioned light-emitting module 10 will be described referring to FIGS. 5 and 6. The luminaire 20 shown in FIG. 5 is provided with four light-emitting modules 10 illustrated in FIG. 1. The four light-emitting modules 10 are arranged in a matrix with 2 rows and 2 columns. The luminaire 20 is further provided with a main body 21, a lighting circuit 22, and attaching portion 23 as shown in FIG. 6. The four light-emitting modules 10 that are provided adjacent to one another are fixed to the attaching portion 23 so that the four light-emitting modules 10 in its entirety form a light-emitting panel in a quadrangular shape. In this case, it is preferable that each of the light-emitting modules 10 be arranged with no gap between the outer peripheries of the reflecting plates 4 of the individual light-emitting modules 10 respectively.

The main body 21 is formed by die-casting or by extrusion molding using an aluminum alloy, and has a frame portion 21a and a flange portion 21b. The main body 21 holds at least the substrate 1. In this embodiment, the main body 21 surrounds a whole of the light-emitting modules 10, as shown in FIGS. 5 and 6. The main body 21 is structured of the frame portion 21a and the flange portion 21b. The frame portion 21a is formed in a quadrangular shape to surround the whole of the four light-emitting modules 10 as shown in FIG. 5. The frame portion 21a is formed slightly larger than an outer periphery of the four light-emitting modules 10 when the outer edges thereof are made closely contact with one another and also slightly larger than the attaching portion 23. The frame portion 21a accommodates therein the light-emitting modules 10 and the attaching portion 23.

The flange portion 21b is formed to protrude inwardly from an edge of the frame portion 21a on the side from which the light of the light-emitting module 10 is allowed to exit as illustrated in FIG. 6. A window surrounded by the flange portion 21b is formed slightly smaller than an outer dimension of the four light-emitting modules 10 when they are assembled together. Accordingly, the light-emitting modules 10 are caught by flange portion 21b, when the light-emitting modules 10 are fitted into the frame portion 21a.

The luminaire 20 is fastened by an ordinary attaching mechanism so that a fixing portion of the main body 21 which is the reverse side of the light-emitting modules 10 makes contact with a ceiling C as shown in FIG. 6. The lighting circuit 22 is connected to the copper foil. 2 serving as the interconnect pattern for each of the light-emitting modules 10, and controls lighting of the LEDs 3. The attaching portion 23 is made of aluminum and formed into a flat plate having a quadrangular shape. The lighting circuit 22 is attached to a side of the attaching portion 23 opposite to a side on which the light-emitting modules 10 are attached.

The luminaire 20 is assembled with a following procedure. First, the light-emitting modules 10 are fastened to the attaching portion 23. In this case, the cover 5 may be attached to each of the light-emitting modules 10 or a single piece of the cover 5 may be assembled for the four light-emitting modules 10. A side of the attaching portion 23 on which the light-emitting modules 10 are attached is first inserted into the frame portion 21a from the fastening side toward the light exit side, so that the light-emitting modules 10 are hitched on the flange portion 21b.

In this state, next, the attaching portion 23 are fastened to the frame portion 21a by an ordinary method so that the light-emitting modules 10 are assembled to the main body 21. The lighting circuit 22 are connected to the light-emitting modules 10, and thereafter the lighting circuit 22 is fastened to the attaching portion 23. The luminaire 20 is successfully assembled with this arrangement.

The luminaire 20 according to this embodiment is configured such that the input power to all of the LEDs 3 per unit area of the outer surface 5a of the cover 5 serving as the heat radiating portion is no greater than 400 [W/m$^2$]. This, for example, corresponds to input power of 400 [W] to the LEDs 3 of the luminaire 20 having the cover 5 of which an area of the outer area 5a is 1 [m$^2$].

In the case of the luminaire 20 according to this embodiment, it is estimated that a coefficient of heat transfer between the cover 5 and an ambient environment is about 10 [W/m$^2$K]. When the input power to the LEDs 3 per unit area of the outer surface 5a of the cover 5 is 400 [W/m$^2$], the temperature of the cover 5 increases by 40 [K] which is obtained from the equation:

$$(400 \; [W/m^2])/(10 \; [W/m^2]).$$

In the light-emitting module 10 according to the present invention, the temperature difference between the solder 6 serving as the heat entry portion and the outer surface 5a of the cover 5 serving as the thermally radiative portion is no greater than 15 [K]. Accordingly, the temperature of the solder 6 becomes 55 [K] which is calculated from the equation of 40 [K]+15 [K], which means that the temperature is 55 [K] at the highest even if the temperature rises. Specifically, if it is assumed that the ambient temperature of a place where the luminaire 20 is installed is 25 degree Celsius [° C.], the temperature of the solder 6 becomes no greater than 80[° C.].

If the temperature of the solder greatly increases, it may occur troubles such as bad contact of the solder portion, a drop in the luminance efficiency of the LED itself, or shortening of life of the LED. However, according to the luminaire 20 of this embodiment, the temperature of the solder 6 is restricted in 55 [K] even if the temperature rises. This means that it is possible to manage the temperature of the solder 6 at 80[° C.] or lower when the ambient temperature is 25[° C.]. Accordingly, it is possible to secure a reliability during use of the luminaire 20 according to the present invention.

Further, in the case of the luminaire 20 according to the foregoing structure, if it is assumed that the input power is 400 [W/m$^2$], and an overall efficiency of the luminaire 20 is 80 [lm/W] (lumen per watt), an apparatus luminous flux per unit area becomes 32000 [lm/m$^2$] (lumen per square meter) based on the equation of 400 [W/m$^2$]×80 [lm/W]. For a luminaire in a square shape having a length of 600 [mm] per side, an apparatus luminous flux of 11520 [lm] can be obtained based on the equation of 32000 [lm/m$^2$]×0.36 [m$^2$]. Similarly, for a luminaire in a square shape having a length of 355 [mm] per side, an apparatus luminous flux becomes 4000 [lm].

These are sufficient luminous fluxes as a light amount required for a base light. In addition, a light amount per unit area exiting from the cover 5, i.e., a luminous emittance, becomes a set value or lower. Since the brightness on a light exit surface is regulated, this luminaire 20 can provide a comfortable luminous environment.

A value that is set as the luminous emittance is, for example, 40000 [lm/m$^2$] or less, preferably in a range of 35000 [lm/m$^2$] or less. If the luminous emittance is larger than this, the brightness on the light exit surface becomes too high, and the glare tends to become noticeable.

In this embodiment, a description has been given of the light-emitting module 10 and the luminaire 20 having a quadrangular shape as an example. However, each external shape is not particularly limited to this example, and may be a round shape or a polygonal shape. Further, the specification describes a preferred embodiment of the present invention. Accordingly, the present invention is not limited to the foregoing embodiment. In addition, the present invention also includes various modifications without departing from the spirit or scope of the present invention. For example, such modifications in the number of LEDs as light-emitting elements, the arrangement of the LEDs, external shapes of the substrate 1, the light-emitting module 10, and the luminaire 20 are included in the scope of the present invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting module comprising:
   a substrate including a thermally conductive portion and an interconnect pattern which are formed on a flat surface in the same plane;
   at least one light-emitting element thermally connected to the thermally conductive portion by solder, electrically connected to the interconnect pattern, and configured to generate heat while emitting light;
   a light distribution control member formed separately from the substrate, the light distribution control member comprising at least one cup corresponding to each of the at least one light-emitting elements, each of the at least one cup comprising a concave portion having a curved surface; a peripheral edge portion located on an incident side with respect to the at least one light-emitting element and extending parallel to an axis of light emission and connected to the concave portion at a discontinuity located farther from the substrate than a top of the at least one light-emitting element between the curved surface of the concave portion and the peripheral edge portion and thermally connected to the thermally conductive portion at a periphery of the light-emitting element by an adhesive; and a ridge portion formed on an exit side configured to project light emitted from the light-emitting element; the light distribution control member configured to control distribution of the light emitted from the light-emitting element; and
   a cover thermally connected to the ridge portion and configured to pass therethrough the light emitted from the light-emitting element.

2. The light-emitting module according to claim 1, wherein the ridge portion is connected by an adhesive to the cover along an entire outer circumference of the light-emitting element.

3. The light-emitting module according to claim 1, wherein the thermally conductive portion also serves as the interconnect pattern, and the light-emitting element is electrically and thermally connected to the thermally conductive portion.

4. The light-emitting module according to claim 1, wherein the thermally conductive portion is formed on 70% or more of an area of the surface of the substrate.

5. The light-emitting module according to claim 1, further comprising:
   a first connecting portion serving as a heat entry portion provided between the light-emitting element and the thermally conductive portion;
   a second connecting portion between the thermally conductive portion and the light distribution control member;
   a third connecting portion between the ridge portion and the cover; and
   a light exit surface serving as a thermally radiative portion provided on the cover, and wherein
   the first connecting portion, the thermally conductive portion, the second connecting portion, the light distribution control member, the third connecting portion, and the cover are configured such that a temperature difference from the heat entry portion to the thermally radiative portion becomes no greater than 15 [K].

6. The light-emitting module according to claim 1, wherein
   the at least one light-emitting element comprises a plurality of light-emitting elements; and
   the at least one cup comprises a plurality of cups, one corresponding to each of the plurality of the light-emitting elements, respectively, each of the plurality of cups comprises four bended reflecting sections and boundary lines between the reflecting sections.

7. The light-emitting module according to claim 6, wherein each of the plurality of cups has a rectangular-shaped opening portion surrounded by the ridge portion; and each ridge portion includes straight segments.

8. A luminaire comprising:
a substrate including a thermally conductive portion and an interconnect pattern which are formed on a flat surface in the same plane;
at least one light-emitting element thermally connected to the thermally conductive portion by solder, electrically connected to the interconnect pattern, and configured to generate heat while emitting light;
a light distribution control member formed separately from the substrate, the light distribution control member comprising at least one cup corresponding to each of the at least one light-emitting elements, each of the at least one cup comprising a concave portion having a curved surface; a peripheral edge portion located on an incident side with respect to the at least one light-emitting element and extending parallel to an axis of light emission and connected to the concave portion at a discontinuity located farther from the substrate than a top of the at least one light-emitting element between the curved surface of the concave portion and the peripheral edge portion and thermally connected to the thermally conductive portion at a periphery of the light-emitting element by an adhesive; and a ridge portion formed on an exit side configured to project light emitted from the light-emitting element; the light distribution control member configured to control distribution of the light emitted from the light-emitting element;
a cover thermally connected to the ridge portion and configured to pass therethrough the light emitted from the light-emitting element;
a main body configured to hold at least the substrate; and
a lighting circuit connected to the interconnect pattern and configured to control lighting of the light-emitting element.

9. The luminaire according to claim 8, wherein
power applied to the light-emitting element per unit area of an exit surface of the cover serving as a thermally radiative portion is no greater than 400 [W/m.sup.2].

10. The light-emitting module according to claim 8, wherein
the at least one light-emitting element comprises a plurality of light-emitting elements; and
the at least one cup comprises a plurality of cups, one corresponding to each of the plurality of the light-emitting elements, respectively, each of the plurality of cups comprises four bended reflecting sections and boundary lines between the reflecting sections.

11. The light-emitting module according to claim 10, wherein
each of the plurality of cups has a rectangular-shaped opening portion surrounded by the ridge portion; and
each ridge portion includes straight segments.

12. A luminaire comprising:
a main body including an attaching portion and a cavity;
at least one light-emitting module disposed in the cavity and fastened on the attaching portion, the light-emitting module comprising: a thermally conductive portion formed on an opposite side from the attaching portion; and at least one light-emitting element thermally connected to the thermally conductive portion by solder and configured to generate heat while emitting light;
a cover configured to cover the cavity, and to allow light emitted from the light-emitting element to pass through; and
a light distribution control member comprising at least one cup corresponding to each of the at least one light-emitting elements, each of the at least one cup comprising a concave portion having a curved surface; and a peripheral edge located on an incident side with respect to the at least one light-emitting element and extending parallel to an axis of light emission and connected to the concave portion at a discontinuity located farther from the substrate than a top of the at least one light-emitting element between the curved surface of the concave portion and the peripheral edge portion and thermally connected between the thermally conductive portion and the cover at a plurality of portions of the thermally conductive portion and a plurality of portions of the cover, and configured to transfer the heat generated by the light-emitting element to the cover directly for radiating the heat in a light-emitting direction.

13. The luminaire according to claim 12, wherein
the luminaire comprises a plurality of light-emitting elements;
the light-emitting elements are arranged in a square matrix; and
the light distribution control member is configured to surround each light-emitting element and includes ridge portions disposed between the light-emitting elements, the ridge portions crossing each other.

14. The luminaire according to claim 13, wherein
the ridge portions are thermally bonded to the cover by adhesive.

15. The light-emitting module according to claim 12, wherein
the at least one light-emitting element comprises a plurality of light-emitting elements; and
the at least one cup comprises a plurality of cups, one corresponding to each of the plurality of the light-emitting elements, respectively, each of the plurality of cups comprises four bended reflecting sections and boundary lines between the reflecting sections.

16. The light-emitting module according to claim 15, wherein
each of the plurality of cups has a rectangular-shaped opening portion surrounded by a ridge portion; and
each ridge portion includes straight segments.

* * * * *